US009812556B2

United States Patent
Mochizuki et al.

(10) Patent No.: US 9,812,556 B2
(45) Date of Patent: Nov. 7, 2017

(54) SEMICONDUCTOR DEVICE AND METHOD OF MANUFACTURING THE SEMICONDUCTOR DEVICE

(71) Applicants: Renesas Electronics Corporation, Kawasaki-shi (JP); International Business Machines Corporation, Armonk, NY (US)

(72) Inventors: Shogo Mochizuki, Kawasaki (JP); Gen Tsutsui, Kawasaki (JP); Raghavasimhan Sreenivasan, Armonk, NY (US); Pranita Kerber, Armonk, NY (US); Qiqing C. Ouyang, Armonk, NY (US); Alexander Reznicek, Armonk, NY (US)

(73) Assignees: Renesas Electronics Corporation, Kawasaki-shi, Kanagawa (JP); International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/142,410

(22) Filed: Dec. 27, 2013

(65) Prior Publication Data

US 2014/0183605 A1    Jul. 3, 2014

Related U.S. Application Data

(60) Provisional application No. 61/747,121, filed on Dec. 28, 2012.

(51) Int. Cl.
*H01L 29/66*    (2006.01)
*H01L 29/78*    (2006.01)

(52) U.S. Cl.
CPC ...... *H01L 29/66795* (2013.01); *H01L 29/785* (2013.01)

(58) Field of Classification Search
CPC ........... H01L 21/823821; H01L 21/845; H01L 27/0886; H01L 27/10826; H01L 29/41791; H01L 29/66795
USPC ......... 257/288, 368, 369; 438/151, 197, 199
See application file for complete search history.

(56) References Cited

U.S. PATENT DOCUMENTS 7,300,837 B2    11/2007    Chen et al.
7,453,124 B2    11/2008    Adan
8,043,920 B2    10/2011    Chan et al.
(Continued)

OTHER PUBLICATIONS

Lee, et al., Hydrogen Annealing Effect on DC and Low-Frequency Noise Characteristics in CMOS FinFETs, IEEE Electron Device Letters, vol. 24, No. 3, Mar. 2003, pp. 186-188.

*Primary Examiner* — Jarrett Stark
*Assistant Examiner* — Shahed Ahmed
(74) *Attorney, Agent, or Firm* — McGinn IP Law Group, PLLC

(57) ABSTRACT

A method of manufacturing a semiconductor device includes forming a plurality of fin structures on a substrate, the plurality of fin structures including a diffusion region, forming an epitaxial layer on the plurality of fin structures in an area of the diffusion region such that a height of the upper surface of the epitaxial layer over plurality of fin structures is substantially equal to the height of the upper surface of the epitaxial layer between the plurality of fin structures, and planarizing the upper surface of the epitaxial layer by one of etch back and reflow annealing.

16 Claims, 15 Drawing Sheets

(56) References Cited

U.S. PATENT DOCUMENTS

| | | | |
|---|---|---|---|
| 2005/0156171 A1* | 7/2005 | Brask | H01L 21/82382 257/72 |
| 2007/0023817 A1* | 2/2007 | Dao | H01L 21/84 257/315 |
| 2008/0020515 A1* | 1/2008 | White | H01L 21/76264 438/118 |
| 2008/0277742 A1 | 11/2008 | Hokazono | |
| 2009/0101978 A1 | 4/2009 | Anderson et al. | |
| 2011/0095378 A1 | 4/2011 | Lee et al. | |
| 2011/0101455 A1 | 5/2011 | Basker et al. | |
| 2011/0133285 A1 | 6/2011 | Liaw | |
| 2011/0193141 A1* | 8/2011 | Lin | H01L 29/045 257/255 |
| 2011/0284967 A1 | 11/2011 | Cheng et al. | |
| 2011/0298058 A1 | 12/2011 | Kawasaki et al. | |
| 2012/0043610 A1 | 2/2012 | Cheng et al. | |
| 2012/0091538 A1* | 4/2012 | Lin | H01L 29/66795 257/401 |
| 2013/0089959 A1* | 4/2013 | Kwok | H01L 29/045 438/283 |

\* cited by examiner

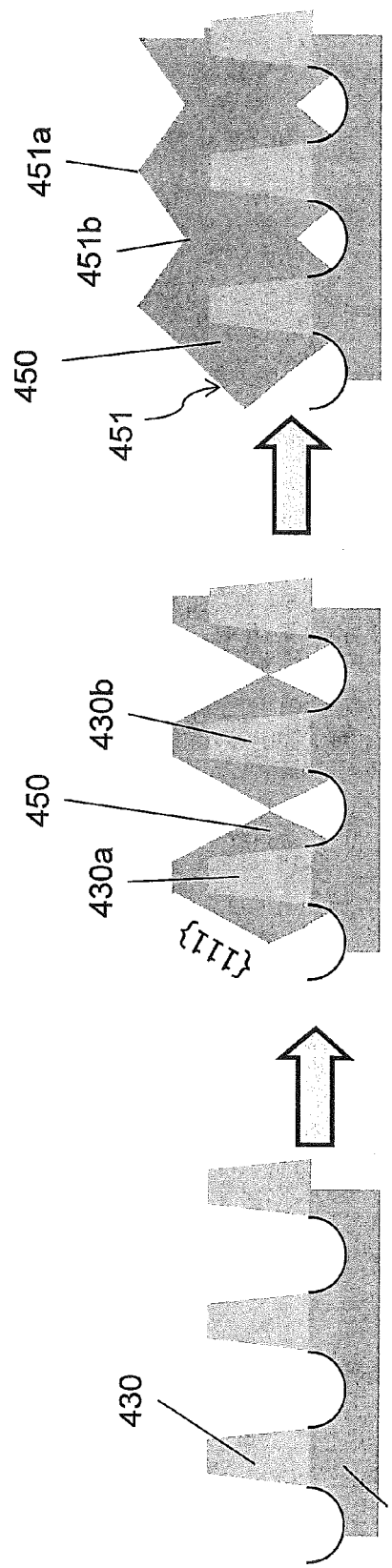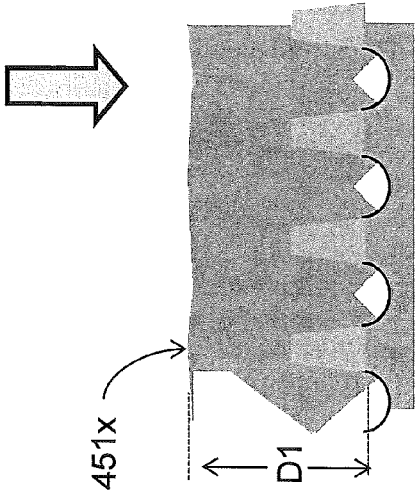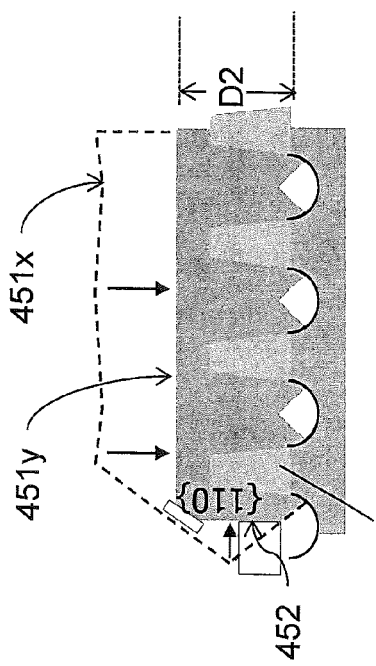

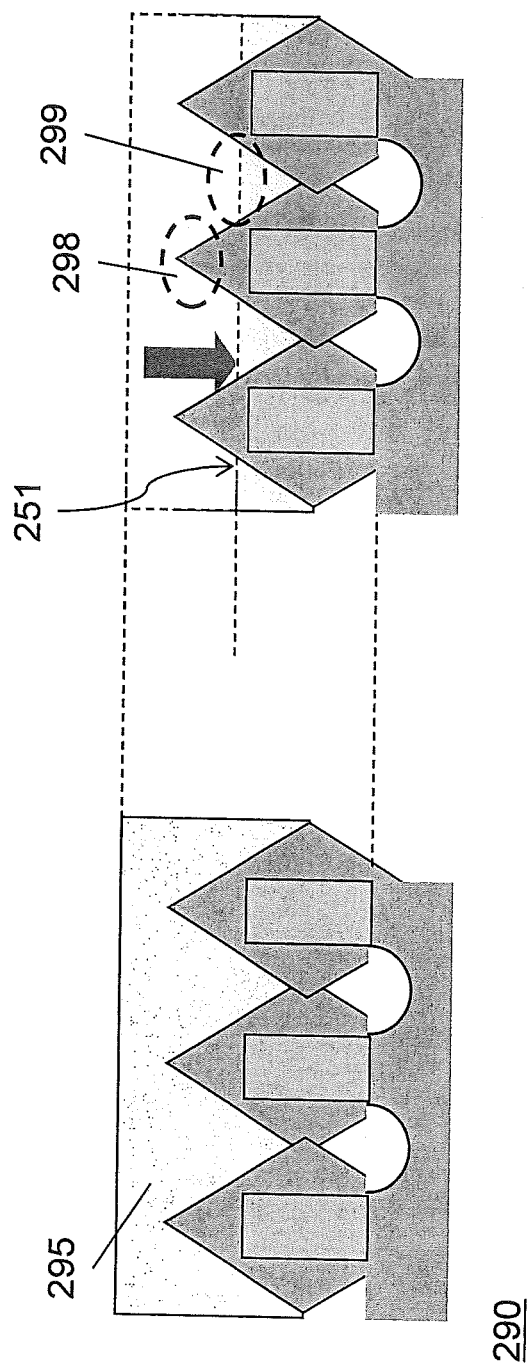

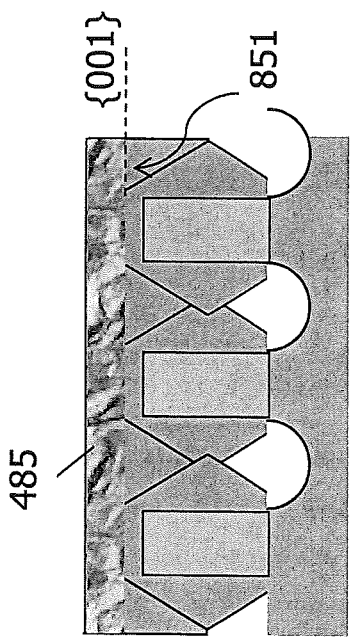
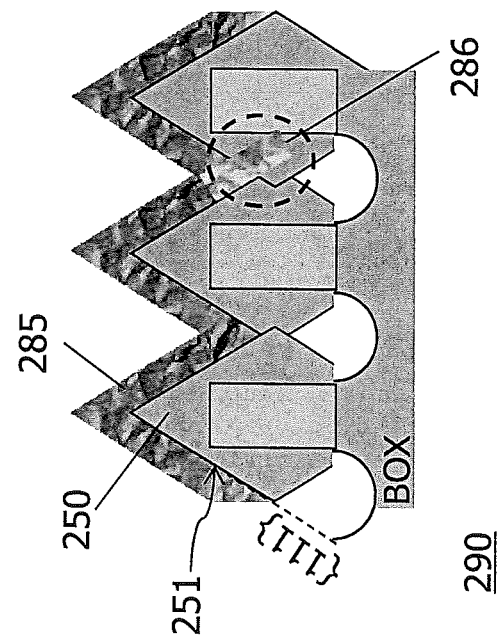
Figure 8A
Figure 8B

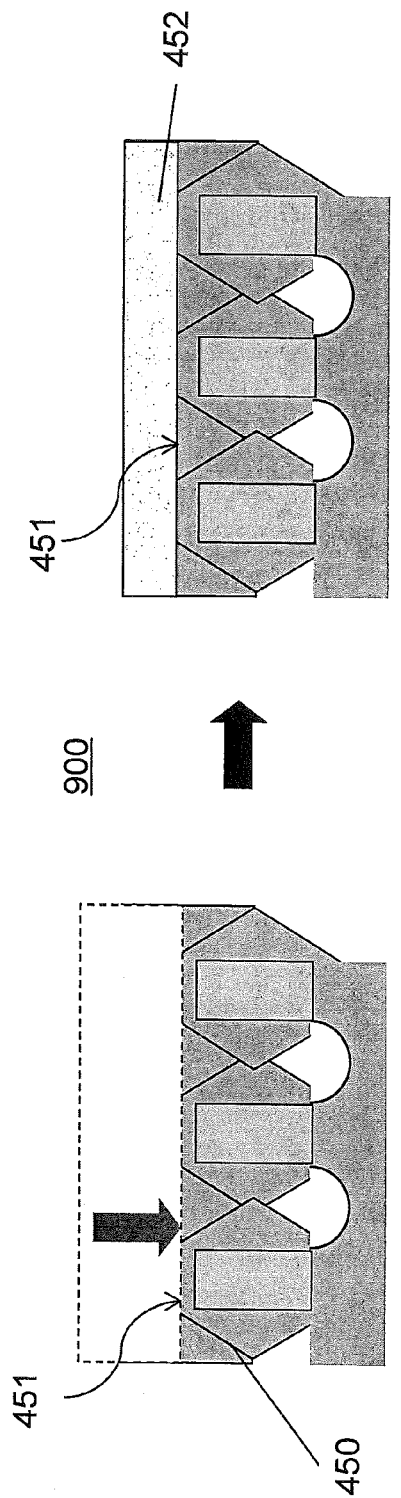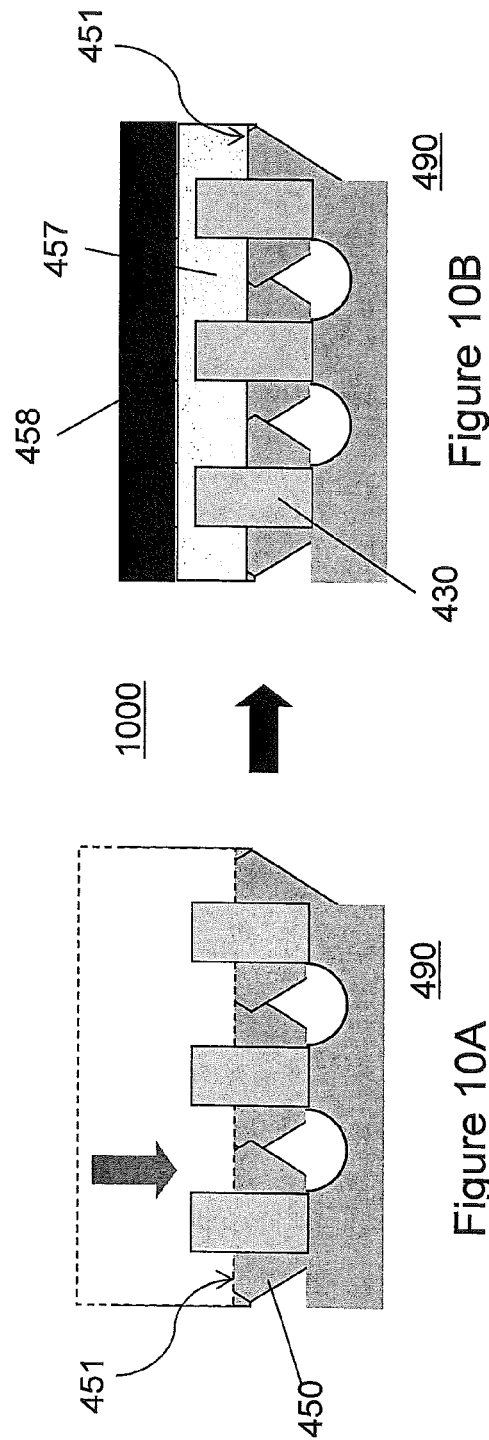

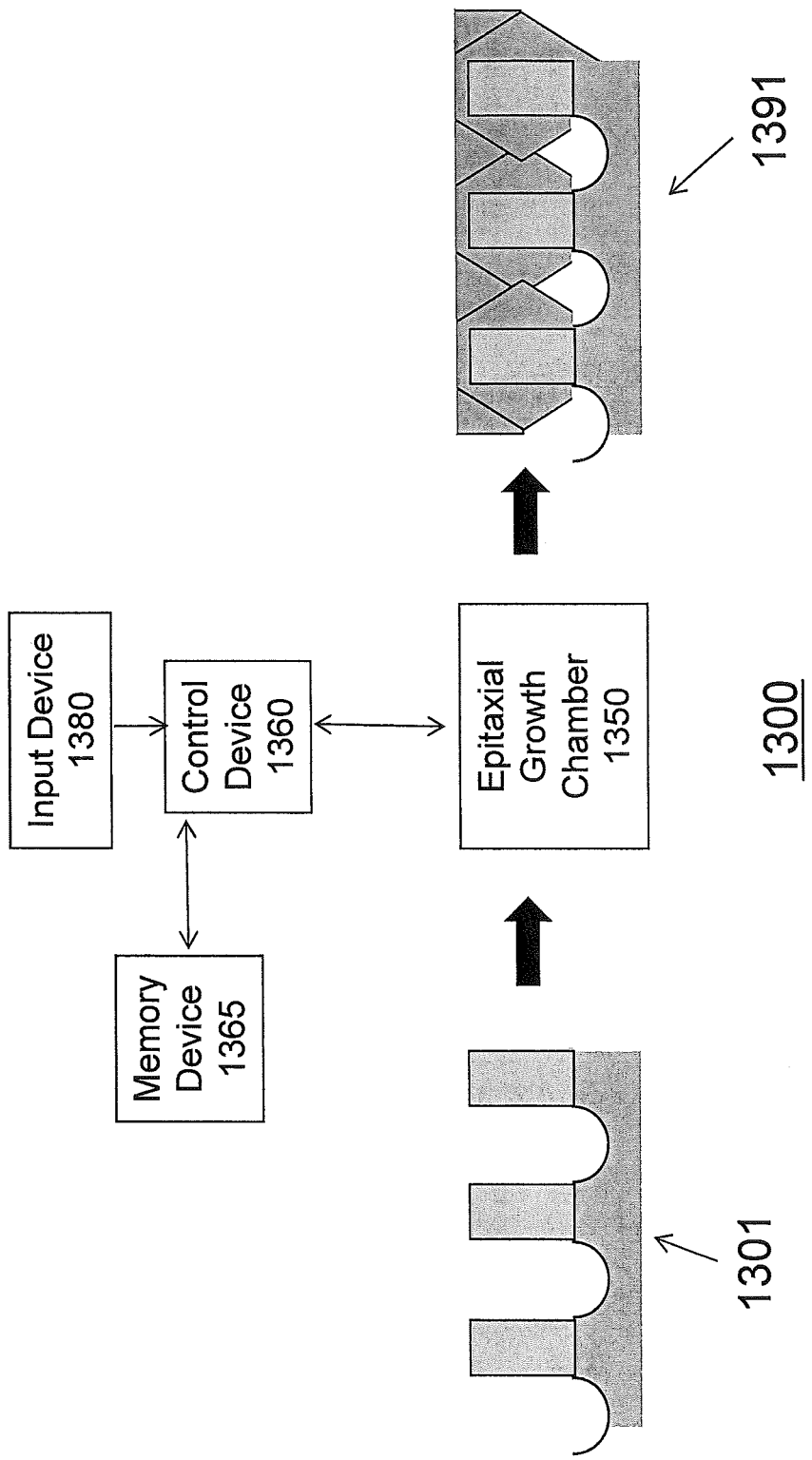

SEMICONDUCTOR DEVICE AND METHOD OF MANUFACTURING THE SEMICONDUCTOR DEVICE

BACKGROUND OF THE INVENTION

Field of the Invention

The present invention relates generally to a semiconductor device and method of manufacturing a semiconductor device and, more particularly, to a method of manufacturing a semiconductor device which includes planarizing an upper surface of an epitaxial layer.

Description of the Related Art

FIG. 1 illustrates a conventional semiconductor device 100 which includes a silicon substrate 110, a buried oxide layer 120 formed on the substrate 110, a plurality of fin structures 130 (hereinafter "fins") formed on the buried oxide layer, and a pair of gate electrodes 140 formed on the plurality of fins 130.

The semiconductor device 100 is a field effect transistor (finFET), in which the plurality of fins are formed of a semiconductor (e.g., silicon), a channel region is formed in the center of each of the plurality of fins 130, diffusion regions (e.g., source region, drain region, etc.) 135 are formed in the opposing ends of the fin 130 on either side of the channel region, and the gate electrodes 140 are formed on each side of the fins 130 in an area corresponding to the channel region.

As illustrated in FIG. 1, the plurality of fins (e.g., silicon) have a <110> crystal orientation along the x-axis and along the y-axis.

FIGS. 2A-2C illustrate a conventional method 200 (e.g., a merging process) of merging the diffusion regions (e.g., the source region and drain region) of the plurality of fins 130 in the semiconductor device 100. In particular, FIGS. 2A-2C illustrate a cross-sectional view of a semiconductor device 100 along the x-axis at "II" in FIG. 1, as the semiconductor device 100 is being transformed into a merged source and drain finFET.

The merged source and drain finFET is the device of choice for 14 nm node and beyond. Merging the fins 130 may allow series resistance to be minimized with little, if any, increase in the parasitic capacitance between the gate electrodes 140 and the source/drain regions, and may allow merged source and drain regions to be contacted by a single contact via as well as more flexible placement of the contact via.

As illustrated in FIG. 2A, a merged source and drain finFET is conventionally formed by growing an epitaxial layer 250 (e.g., epitaxial silicon layer) on the source and drain region 135 (e.g., an exposed surface of the source and drain region 135) of the plurality of fins 130.

As illustrated in FIG. 2B, as the epitaxial layer 250 grows on the source and drain regions 135 of the plurality of fins 130, the plurality of fins 130 are merged (e.g., partially or completely merged) by the epitaxial layer 250. Since a top surface of a fin 130 has a <100> crystal orientation, and a sidewall of a fin 130 has a <110> crystal orientation, and since epitaxial growth on different crystal orientations has different growth rates, the epitaxial layer 250 is typically grown as a faceted epitaxial layer 250 with a {111} facet diamond-shape, as illustrated in FIG. 2B.

FIG. 2C illustrates the merged source and drain finFET 290 upon completion of the merging process. As illustrated in FIG. 2C, in the merged source and drain finFET 290, the epitaxial layer 250 includes an upper surface 251 having a peak 251a formed over the plurality of fins 130, and a valley 251b found between the plurality of fins 130 (e.g., formed at a location which is substantially midway between the plurality of fins 130). For example, before the planarizing of the upper surface of the epitaxial layer, a difference between a height of the peak 251a and a height of the valley 251b is typically at least 10 nm.

That is, the conventional method 200 in FIGS. 2A-2C is highly susceptible to forming a non-uniform source and drain height, which results in the surface roughness on the upper surface 251 of the epitaxial layer 250.

The surface roughness of the upper surface 251 of the epitaxial layer 250 causes several concerns. First, the surface roughness may cause a variability in parasitic capacitance in the device 290. Second, the surface roughness may cause the device 290 to be less compatible with a trench silicide module. Third, the surface roughness may facilitate lateral epitaxial growth, especially at a region of an SRAM. Fourth, the surface roughness may facilitate a formation of $NiSi_2$ on the {111} face of the epitaxial layer 250 (e.g., on the upper surface 251), in a subsequent silicidation step.

SUMMARY

In view of the foregoing and other exemplary problems, disadvantages, and drawbacks of the aforementioned conventional methods and systems, an exemplary aspect of the present invention is directed to a method and system of manufacturing a semiconductor device which may provide an improved upper surface of an epitaxial layer.

An exemplary aspect of the present invention is directed to a method of manufacturing a semiconductor device which includes forming a plurality of fin structures on a substrate, the plurality of fin structures including a diffusion region, forming an epitaxial layer on the plurality of fin structures in an area of the diffusion region such that a height of the upper surface of the epitaxial layer over plurality of fin structures is substantially equal to the height of the upper surface of the epitaxial layer between the plurality of fin structures, and planarizing the upper surface of the epitaxial layer by etch back.

Another exemplary aspect of the present invention is directed to a method of manufacturing a semiconductor device, which includes forming a plurality of fin structures on a substrate, the plurality of fin structures including a diffusion region, forming an epitaxial layer on the plurality of fin structures in an area of the diffusion region such that a first growth front of the epitaxial layer on a first fin structure of the plurality of fin structures contacts a second growth front of the epitaxial layer on a second fin structure of the plurality of fin structures, and planarizing the upper surface of the epitaxial layer by reflow annealing.

Another exemplary aspect of the present invention is directed to a semiconductor device including a plurality of fin structures formed on a substrate, the plurality of fin structures including a diffusion region, and an epitaxial layer on the plurality of fin structures in an area of the diffusion region such that a height of the upper surface of the epitaxial layer over plurality of fin structures is substantially equal to the height of the upper surface of the epitaxial layer between the plurality of fin structures, a variation in the height of the upper surface of the epitaxial layer is less than 5 nm.

With its unique and novel features, the present invention may provide a method and system of manufacturing a semiconductor device which may provide an improved upper surface of an epitaxial layer.

BRIEF DESCRIPTION OF THE DRAWINGS

The foregoing and other exemplary purposes, aspects and advantages will be better understood from the following detailed description of the embodiments of the invention with reference to the drawings, in which:

FIG. 4A illustrates a part of a method 400 of manufacturing a semiconductor device, according to another exemplary aspect of the present invention;

FIG. 4B illustrates another part of a method 400 of manufacturing a semiconductor device, according to another exemplary aspect of the present invention;

FIG. 4C illustrates another part of a method 400 of manufacturing a semiconductor device, according to another exemplary aspect of the present invention;

FIG. 4D illustrates another part of a method 400 of manufacturing a semiconductor device, according to another exemplary aspect of the present invention;

FIG. 4E illustrates another part of a method 400 of manufacturing a semiconductor device, according to another exemplary aspect of the present invention;

FIG. 7A illustrates an interlayer dielectric film 295 formed on the epitaxial layer 250 in the device 290, according to an exemplary aspect of the present invention;

FIG. 7B illustrates the interlayer dielectric film 295 after an trench etching of the film 295 (e.g., etching in a direction of the arrow), according to an exemplary aspect of the present invention;

FIG. 8A illustrates a silicide layer 285 (e.g., nickel silicide layer) formed on the upper surface 251 of the epitaxial layer 250 in the conventional device 290, according to an exemplary aspect of the present invention;

FIG. 8B illustrates a nickel silicide layer 485 formed on the upper surface 451 of the epitaxial layer 450, according to an exemplary aspect of the present invention;

FIG. 9A illustrates a part of a method 900 of manufacturing a semiconductor device, according to another exemplary aspect of the present invention;

FIG. 9B illustrates another part of method 900 of manufacturing a semiconductor device, according to another exemplary aspect of the present invention;

FIG. 10A illustrates a part of a method 1000 of manufacturing a semiconductor device, according to another exemplary aspect of the present invention;

FIG. 10B illustrates another part of method 1000 of manufacturing a semiconductor device, according to another exemplary aspect of the present invention;

FIG. 13 illustrates a system 1300 for manufacturing a semiconductor device, according to an exemplary aspect of the present invention;

DETAILED DESCRIPTION OF THE EXEMPLARY EMBODIMENTS OF THE INVENTION

Figure 1:
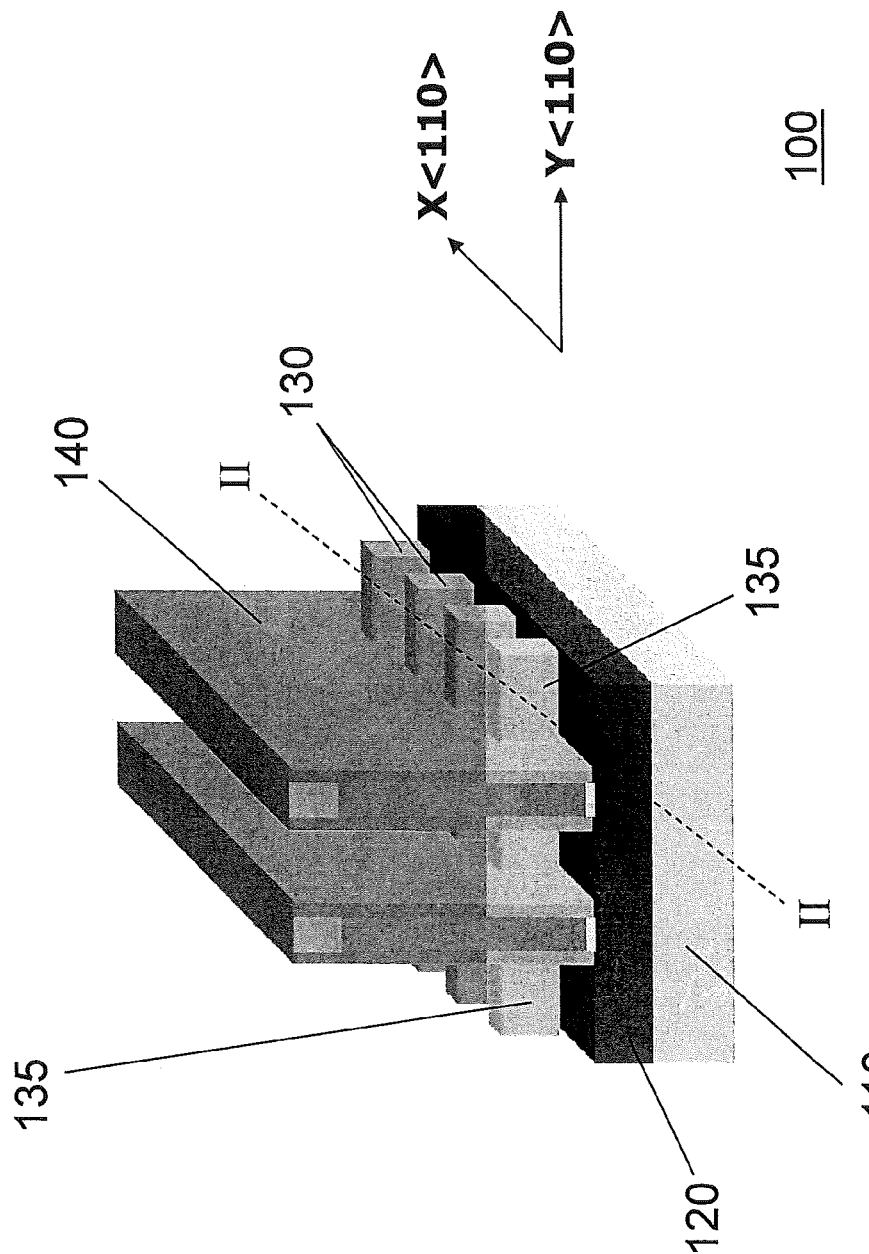
FIG. 1 illustrates a conventional semiconductor device.

Referring now to the drawings, FIGS. 3-15 illustrate some of the exemplary aspects of the present invention.

Figure 3:
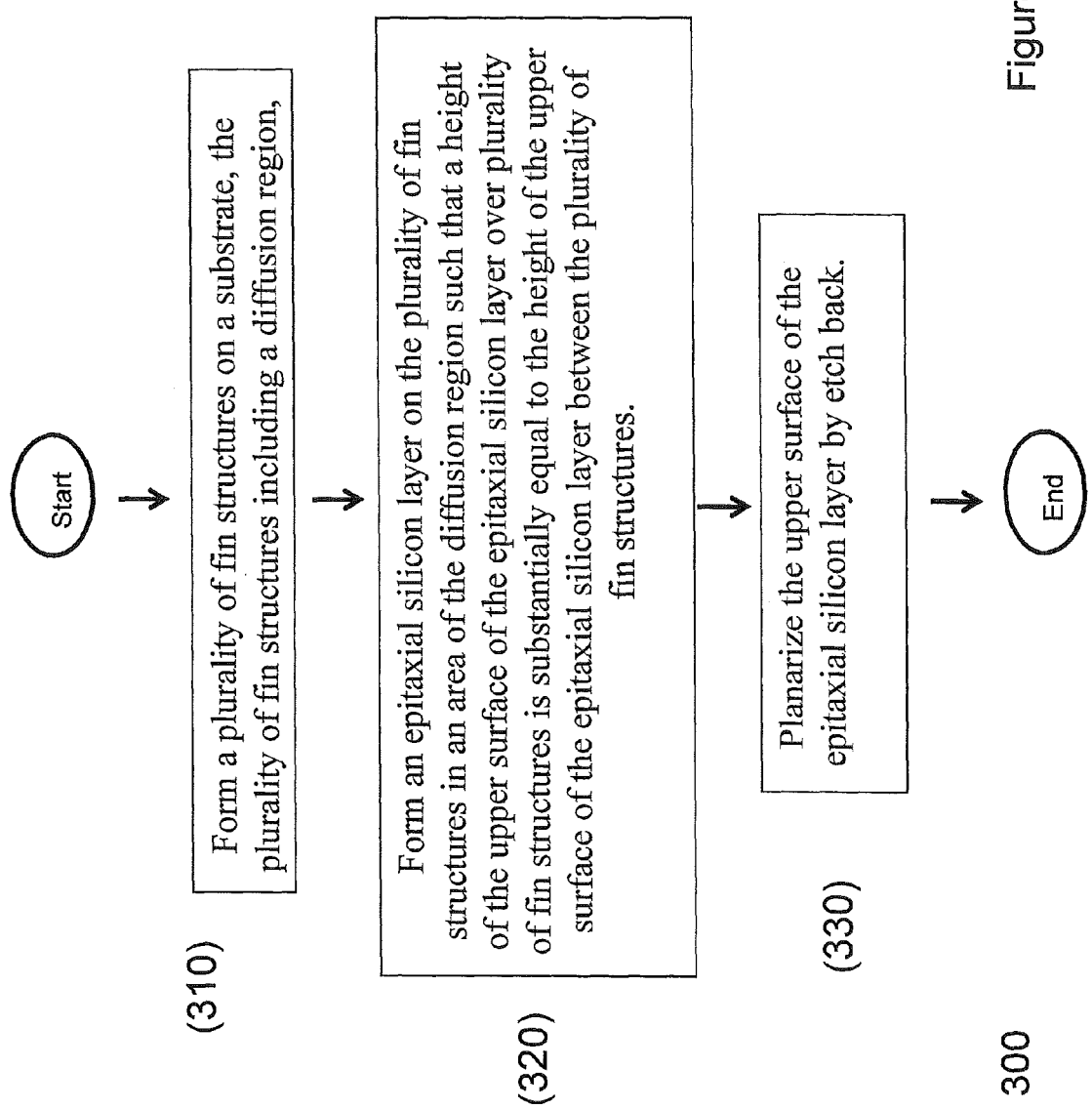
FIG. 3 illustrates a method 300 of manufacturing a semiconductor device, according to an exemplary aspect of the present invention.

In particular, FIG. 3 illustrates a method 300 of manufacturing a semiconductor device, according to an exemplary aspect of the present invention.

As illustrated in FIG. 3, the method 300 includes forming (310) a plurality of fin structures on a substrate, the plurality of fin structures including a diffusion region, forming (320) an epitaxial layer (e.g., epitaxial silicon layer) on the plurality of fin structures in an area of the diffusion region such that a height of the upper surface of the epitaxial layer over the plurality of fin structures is substantially equal to the height of the upper surface of the epitaxial layer between the plurality of fin structures, and planarizing (330) the upper surface of the epitaxial layer by etch back.

The exemplary aspects of the present invention may eliminate the problems of the surface roughness of the upper surface of the epitaxial layer of the conventional methods. That is, the method 300 may avoid the peaks and valleys in the upper surface of the epitaxial layer and provide a uniform upper surface.

FIGS. 4A-4E illustrate a method 400 of manufacturing a semiconductor device according to another exemplary aspect of the present invention.

As illustrated in FIG. 4A, the method 400 includes forming a plurality of fins 430 on a substrate 420 (e.g., a buried oxide layer). The plurality of fins 430 may be formed of a semiconductor such as silicon, germanium, silicon germanium, etc. The fins 430 may also include diffusion regions such as source and drain regions.

As illustrated in FIG. 4B, the method 400 includes growing an epitaxial layer 450 on an exposed surface of the fin 430 (e.g., performing a selective epitaxial growth). The epitaxial layer 450, like the fins on which the layer 430 is formed, may include a semiconductor such as silicon, germanium, silicon germanium, etc.

Further, the epitaxial layer 450 may be formed on an upper surface of the fins 430 having a <100> crystal orientation and a side surface of the fins 430 having a <110> crystal orientation, and in an area of the source and drain regions. Since epitaxial growth on different crystal orientations has different growth rates, the epitaxial layer 450 may include a cross-section including a diamond-shaped facet having a {111} crystal orientation, as illustrated in FIG. 4B.

The growing of the epitaxial layer 450 (e.g., the merging process) may be continued such that the growth-fronts of the epitaxial layer meet. That is, a growth front on a portion of the epitaxial layer 450 being formed on a first fin 430a contacts a growth front on a portion of the epitaxial layer 450 being formed on a second fin 430b which is adjacent to the first fin 430. That is, the forming of the epitaxial layer 450 may include merging the diffusion region of the first fin structure 430a with the diffusion region of the second fin structure 430b.

The growth "process" of growing the epitaxial layer 450 can be timed and may depend, for example, on fin pitch (e.g., distance between the plurality of fins) and other process parameters.

FIG. 4C illustrates a device 490 having merged source and drain regions (e.g. a merged source and drain region finFET) upon completion of the merging process. As illustrated in FIG. 4C, in the device 490, the epitaxial layer 450 includes an upper surface 451 having a peak 451a formed over the plurality of fins 430, and a valley 451b formed between the plurality of fins 430 (e.g., formed at a location which is substantially midway between the plurality of fins 430).

As illustrated in FIG. 4D, unlike the conventional method 200 which stops the growing of the epitaxial layer 250 at a point where the upper surface 251 includes a peak 251a and a valley 251b, the method 400 may continue to grow the epitaxial layer 450 on the plurality of fin structures 430 in order to substantially eliminate the peak 451a and valley 451b. That is, as illustrated in FIG. 4D, the epitaxial layer 450 may be grown such that a height of the upper surface 451x of the epitaxial layer 450 over the plurality of fin structures 430 (after the growing of the epitaxial layer 450) is substantially equal to the height of the upper surface 451x of the epitaxial layer 450 between the plurality of fin structures 430. For example, the forming of the epitaxial layer 450 may include epitaxially growing silicon until a distance D1 between the surface of the substrate 420 (e.g., an upper surface of a buried oxide layer) and the upper surface 451 of the epitaxial layer at a location over the first and second fin structures 430a, 430b and at a location between the first and second fin structures 430a, 430b is at least 50 nm, or more particularly, in a range from 50 nm to 100 nm.

As illustrated in FIG. 4E, the method 400 may include planarizing (e.g., etching back) the upper surface 451x of the epitaxial layer 450 to form the upper surface 451y of the epitaxial layer 450, and control a height of the upper surface 451. The planarization (e.g., etching) may include, for example, an HCl etching and may be performed in the same processing chamber as the epitaxial growth chamber used to grow the epitaxial layer 450 (i.e., the etching may be performed in situ). That is, the etching (e.g., the planarizing of the upper surface of the epitaxial layer 450) may be performed after the forming of the epitaxial layer without interruption and in the same chamber.

Further, as illustrated in FIG. 4E, the upper surface 451y after the planarization may have an improved surface roughness compared to the upper surface 251 of the conventional device 290. In particular, For example, after the planarizing of the upper surface 451, a difference between a greatest height of the upper surface 451 and the least height may be less than 5 nm, which is significantly improved over the conventional device 290 in which the difference between peaks and valleys may be at least 10 nm.

Further, the etching (e.g., planarizing) of the upper surface 451 of the epitaxial layer 450 may include planarizing the upper surface 451 of the epitaxial layer 450 until a distance D2 between a surface of the substrate 420 (e.g., an upper surface of the buried oxide layer) and the upper surface 451 of the epitaxial layer 450 at a location over the first and second fin structures 430a, 430b and at a location between the first and second fin structures 430a, 430b is in a range from 20 nm to 50 nm, or more particularly, in a range from 35 mm to 40 nm.

The height of the upper surface 451 after the forming of the epitaxial layer 450 is not limited. That is, regardless of the height of the upper surface 451, the upper surface 451 after the planarizing of the upper surface 451 (e.g., after the etching back of the upper surface 451) can be controlled by optimizing the planarizing condition (e.g., optimizing an etching condition).

After the growth process of the epitaxial layer 450, the upper surface 451x of the epitaxial layer 450 is substantially flat, but may include a small degree of surface roughness (e.g., due to the formation of the diamond shaped facet). The etching back of the upper surface in FIG. 4E may reduce the surface roughness of the upper surface 451x so that the upper surface 451y after the etching back may be more smooth and more uniformly flat than the upper surface 451x.

In addition, after the etching back in FIG. 4E, an additional epitaxy may be performed to further "tune" the height of the upper surface of the epitaxial layer 450 (e.g., to set a thickness of the epitaxial layer 450). In particular, the etching back the upper surface 451 of the epitaxial layer 450 may be such that a height of the upper surface 451 is greater than a height of an upper surface of the plurality of fin structures 430. In an exemplary aspect of the present invention, the etching back the upper surface 451 may be such that a height of the upper surface 451 is at least 10 nm greater than a height of an upper surface of the plurality of fin structures 430.

Further, the method 400 may also include, after the forming of the epitaxial layer 450 but before the planarizing of the upper surface 451 of the epitaxial layer 450, doping the epitaxial layer 450. In this case, the planarizing of the upper surface 451 (e.g., planarizing of the upper surface 451) may include reducing a height of the upper surface 451 of the doped epitaxial layer 450.

Further, as illustrated in FIG. 4E, the method 400 may also include concurrently with the planarizing of the upper surface 451 of the epitaxial layer 450, etching back a lateral side surface 452 of the epitaxial layer 450 at an edge of the plurality of fin structures 430 (e.g., a side surface having a <110> crystal orientation). For example, where the substrate 420 includes a buried oxide layer, the etching back of the lateral side surface 452 of the epitaxial layer 450 may include etching back the lateral side surface 452 of the epitaxial layer 450 such that the lateral side surface 452 extends from the buried oxide layer 420 to the upper surface 451 of the epitaxial layer 450, and is substantially perpendicular to the upper surface 451 of the epitaxial layer 450.

In addition, the etching back of the lateral side surface 452 of the epitaxial layer 450 may include etching back the lateral side surface 452 of the epitaxial layer 450 such that a distance between the lateral side surface 452 and an outermost fin structure (e.g., fin 430a) of the plurality of fin structures is 10 nm or less. In addition, the reducing of the lateral width of the epitaxial layer 450, may be performed simultaneously with the decreasing of the surface roughness of the upper surface 451 and with the reducing of the thickness of the epitaxial layer 450.

In addition, after the planarization of the upper surface 451 by etch back in FIG. 4E, another planarization may be performed in order to further improve the upper surface 451. For example, a reflow annealing (e.g., annealing in a hydrogen ambient) may be performed after the planarization by etch back.

Figure 5B:
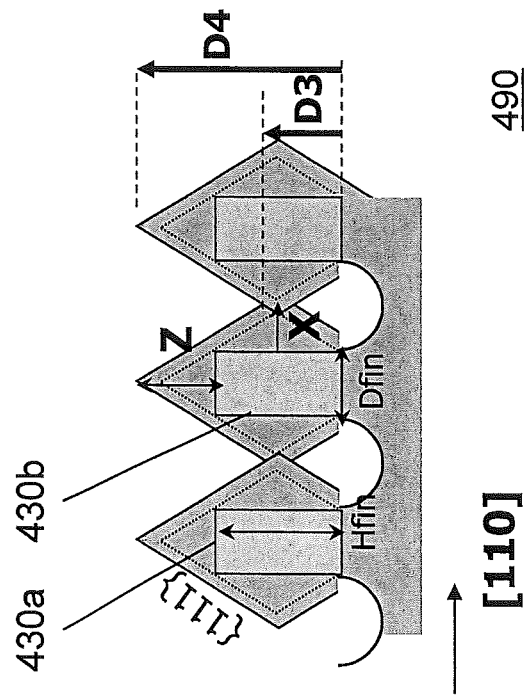
FIG. 5B provides another detailed view of an epitaxial layer, according to an exemplary aspect of the present invention.
Figure 5A:
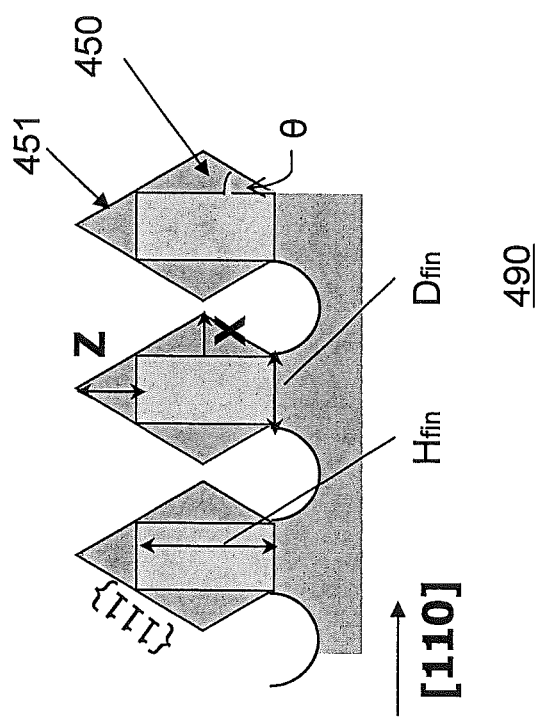
FIG. 5A provides a detailed view of an epitaxial layer, according to an exemplary aspect of the present invention.

FIGS. 5A and 5B provide a detailed view of an epitaxial layer, according to an exemplary aspect of the present invention. The detailed view may be helpful for understanding a calculation of an amount of surface roughness of the upper surface 451 of the epitaxial layer 450.

In particular, FIG. 5A illustrates a cross-sectional view of the semiconductor device 490 at an initial stage of growth of the epitaxial layer 450, according to an exemplary aspect of the present invention.

Referring to FIG. 5A, assuming that $H_{fin}$ is a height of a fin 430 and $D_{fin}$ is a width of a fin 430 in an X-axis direction (e.g., a direction of <110> crystal orientation of the epitaxial layer 450), and that an angle θ is 35.3° (e.g., determined from experimental observation) then a lateral growth distance (X) of the epitaxial layer 450 (e.g., the greatest distance in the X-axis direction between an a sidewall of the fin 430 and the surface of the epitaxial layer 450) is given by Equation 1 below.

$$\text{Epi\_Lateral\_Growth}(X) = \tfrac{1}{2}H\text{fin} \cdot \tan(35.3 \text{ deg})$$
$$= 0.354 \cdot H\text{fin} \qquad \text{Eq. 1}$$

Further, the overgrowth amount of the epitaxial layer 450 (e.g., amount of growth in the Z-axis direction at a location of a center of an upper surface of the fins 430) is given by Equation 2 below.

$$\text{Epi\_Over\_Growth}(Z) = (X + \tfrac{1}{2}D\text{fin}) \cdot \tan(54.7 \text{ deg}) - \tfrac{1}{2}H\text{fin} = 1.41 \cdot (X + \tfrac{1}{2}D\text{fin}) - \tfrac{1}{2}H\text{fin} \qquad \text{Eq. 2}$$

Table 1 below provides some exemplary values for $H_{fin}$ and $D_{fin}$, and an estimate of the lateral growth distance (X) and the overgrowth distance (Z), which were calculated using Equation 1 and Equation 2. Table 1 is intended to be illustrative and should not be considered as limiting the present invention in an respect.

TABLE 1

| Hfin (nm) | Dfin (nm) | X (nm) | Z (nm) |
|---|---|---|---|
| 20 | 5 | 7.1 | 3.5 |
| 20 | 10 | 7.1 | 7.1 |
| 20 | 15 | 7.1 | 10.6 |
| 30 | 10 | 10.6 | 7 |
| 30 | 15 | 10.6 | 10.52 |
| 30 | 20 | 10.6 | 14 |
| 40 | 15 | 14.2 | 10.6 |
| 40 | 20 | 14.2 | 14.1 |
| 40 | 25 | 14.2 | 17.6 |

FIG. 5B illustrates a cross-sectional view of the semiconductor device 490 at a point in time when the epitaxial layer 450 forming on a first fin structure (e.g., fin 430a) has merged with the epitaxial layer 450 forming on a second fin structure which is adjacent to the first fin structure (e.g., fin 430b).

Generally, a distance D3 (e.g., a minimum distance between a surface of the substrate and the upper surface 451 at a point between (e.g., substantially midway between) adjacent fin structures 430) may be in a range from 10 nm to 30 nm (e.g., about 20 nm), and a distance D4 (e.g., a maximum distance between a surface of the substrate and the upper surface 451 at a point above the fin structure 430 (e.g., near a center of an upper surface of the fin structure 430) may be in a range from 40 nm to 60 nm (e.g., about 50 nm).

Figure 6B:
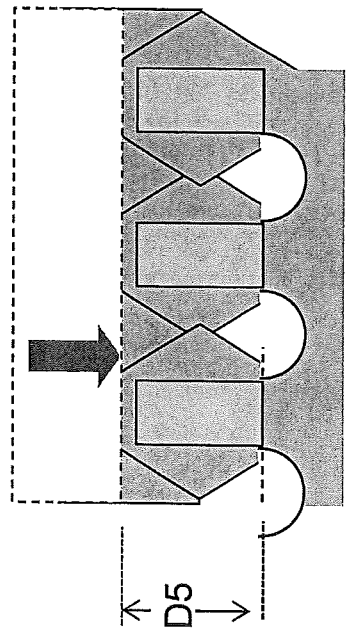
FIG. 6B illustrates a cross-sectional view of the semiconductor device 490 after the planarizing of the upper surface 451 (e.g., after an etching back of the upper surface 451), according to an exemplary aspect of the present invention.
Figure 6A:
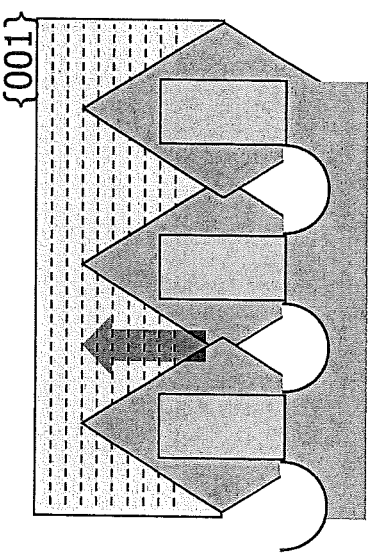
FIG. 6A illustrates a cross-sectional view of the semiconductor device 490 after a growth of the epitaxial layer 450, according to an exemplary aspect of the present invention.

FIG. 6A illustrates a cross-sectional view of the semiconductor device 490 after a growth of the epitaxial layer 450, according to an exemplary aspect of the present invention. Initially, a growth of the epitaxial layer 450 is on a surface having a <111> crystal orientation, and growth on the <111> surface is slow. However, as the growth of the epitaxial layer 450 proceeds in a direction of the arrow (e.g., in a Z-axis direction which is perpendicular to the X-axis direction) the upper surface 451 of the epitaxial layer 450 has a <001> crystal orientation, and growth on the <001> surface is fast (e.g., faster than the growth on the <111> surface.

FIG. 6B illustrates a cross-sectional view of the semiconductor device 490 after the planarizing of the upper surface 451 (e.g., after an etching back of the upper surface 451), according to an exemplary aspect of the present invention. As illustrated in FIG. 6B, a planarizing of the upper surface 451 is in the Z-axis direction and substantially opposite to the direction of the growth of the epitaxial layer 450 in FIG. 6A.

Generally, a distance D5 between the upper surface of the substrate (e.g., surface of a buried oxide layer) and the upper surface 451 may be substantially uniform (e.g., substantially flat) over an area of the upper surface 451 (e.g., over a substantial entirety of the upper surface 451). That is, there may be little or no height variation in the upper surface 451. For example, after the planarizing of the upper surface 451, a difference between a greatest height of the upper surface 451 and the least height may be less than 5 nm. Further, the distance D5 at a point over the plurality of fin structures 430 and at a point between (e.g., substantially midway between) adjacent fin structures 430 may be in a range from 25 nm to 55 nm, or more particularly, in a range from 35 nm to 40 nm.

The exemplary aspects of the present invention may provide several advantages over the conventional methods. First, the reduction in the height of the upper surface 451 in the semiconductor device 490 may result in a reduction in variability of the parasitic capacitance in the device 490 as compared to a device (e.g., device 290) manufactured by the conventional method. That is, a variability in the height of the upper surface 451 may cause a variability in parasitic capacitance. Thus, the variability in parasitic capacitance should be reduce by reducing the height variability of the upper surface 451.

Second, the device 490 may have an increased compatibility with a trench silicide module, as compared to a device (e.g., device 290) manufactured by a conventional method.

Figure 2:
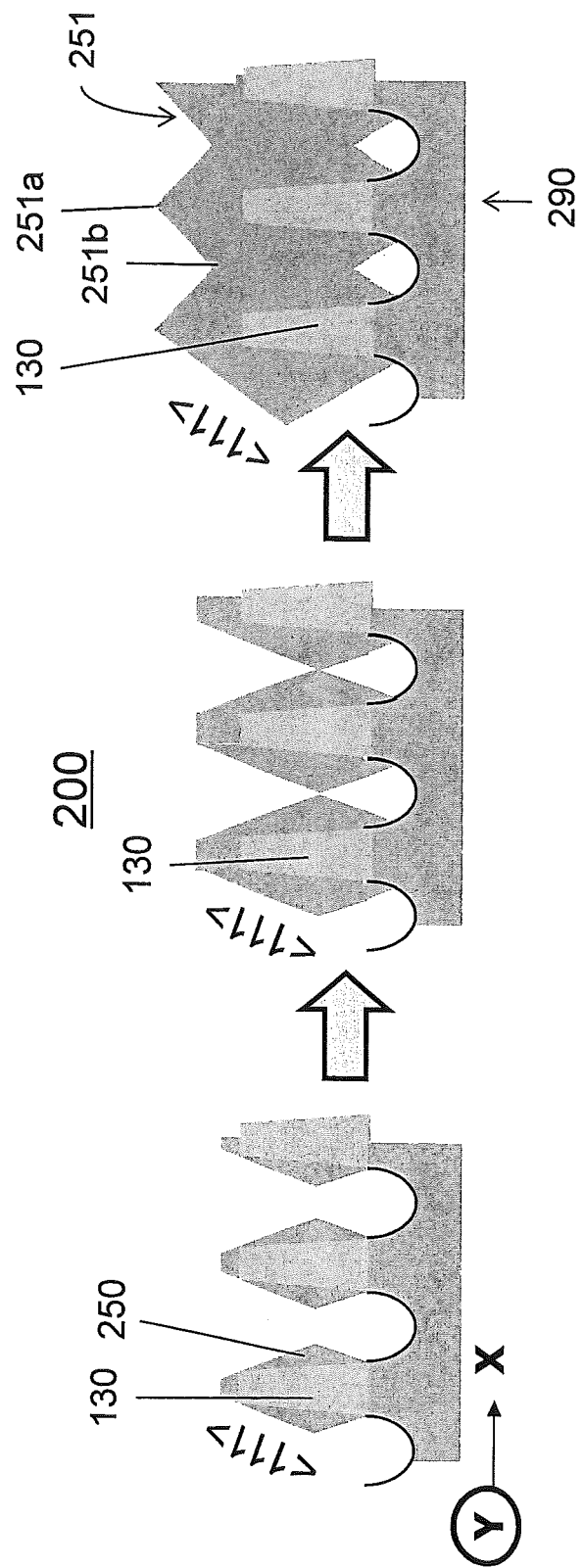
FIG. 2 illustrates a conventional method 200 of manufacturing a semiconductor device.

For example, FIG. 7A illustrates an interlayer dielectric film 295 formed on the epitaxial layer 250 in the device 290 (e.g., see FIG. 2C). FIG. 7B illustrates the interlayer dielectric film 295 after an trench etching of the film 295 (e.g., etching in a direction of the arrow). As illustrated in FIG. 7B, the variation in the height of a surface 251 of the epitaxial layer 250, results in an overetched area 298 and an under-etched area 299. That is, some parts of the device 290 get over etched, and some parts of the device 290 get under etched during the trench etching.

Third, as noted above with respect to FIG. 4E, the exemplary aspects of the present invention may allow for a controlling of lateral epitaxial growth of the epitaxial layer 450. That is, in the planarizing of the epitaxial layer, the epitaxial layer can be etched along not only vertical but also the lateral direction (e.g. in an X-axis direction). In particular, the planarizing of the upper surface 451 may include an anisotropic etching (e.g., anisotropic etching by HCl). That is, an etching rate on the {001} surface and the {110} surface of the epitaxial layer 450 may be fast, and the etching rate on the {111} surface may be slow (e.g., slower than the etching rate on the {001} surface).

Fourth, the device 490 may allow for an improved silicidation of the upper surface 451, as compared to a device (e.g., device 290) manufactured by a conventional method.

For example, FIG. 8A illustrates a silicide layer 285 (e.g., nickel silicide layer) formed on the upper surface 251 of the epitaxial layer 250 in the conventional device 290.

$NiSi_2$ has higher sheet resistance than NiSi (e.g., the resistivity ($\mu\Omega cm$) of NiSi is in a range from 10.5-18, whereas the resistivity of $NiSi_2$ is in a range from 34-50), and therefore, NiSi is preferred to be found in the silicidation of the epitaxial layer 250 instead of $NiSi_2$. However, the upper surface 251 has a <111> crystal orientation and $NiSi_2$ (and not NiSi) tends to grow epitaxially on the Si {111} plane. Thus, the silicide layer 285 in the conventional device 290 typically includes $NiSi_2$ and not the preferred NiSi.

In addition, the conventional device 290 typically includes a silicide pipe 286 which results from a nickel diffusion on the {111} plane. Further, if the silicide layer 285 is etched, the amount of etching on the upper surface 251 is likely to vary greatly over the upper surface 250.

FIG. 8B illustrates a nickel silicide layer 485 formed on the upper surface 451 of the epitaxial layer 450, according to an exemplary aspect of the present invention. The nickel silicide layer 485 may be formed by depositing a metal layer on the upper surface 451 of the epitaxial layer 450, and heating the substrate to silicide the upper surface 451 of the epitaxial layer 450. It should be noted that although nickel silicide is used in the description of the method 1000, other silicides such as cobalt silicide, tungsten silicide, titanium, etc. may be used.

As illustrated in FIG. 8B, the upper surface 451 may include a substantially flat surface and may have a <001> crystal orientation. Therefore, NiSi is formed in the silicidation of the upper surface 451, and not $NiSi_2$. In addition, since the upper surface 451 is substantially flat, the risk of formation of the silicide piping and the risk of a variability of an etching amount of the silicide 485 is much reduced in the device 490 compared to the device 290.

Figure 8D:
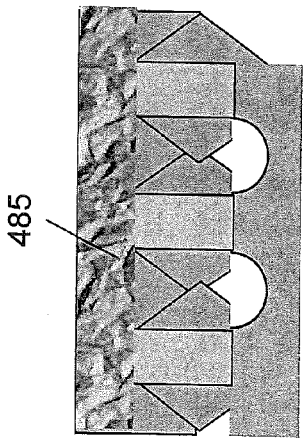
FIG. 8D illustrates another importance of the height of the upper surface 451.
Figure 8F:
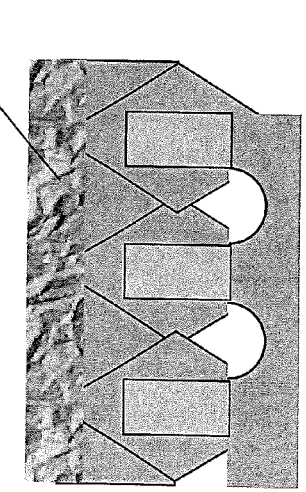
FIG. 8F illustrates another importance of the height of the upper surface 451.
Figure 8C:
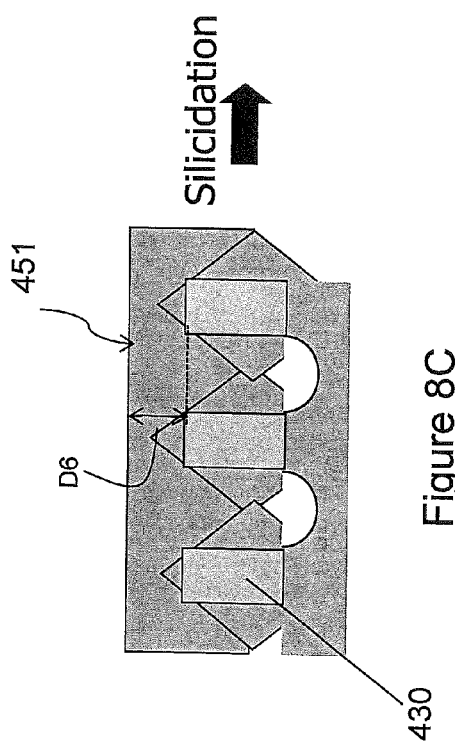
FIG. 8C illustrates an importance of the height of the upper surface 451.

FIGS. 8C-8F illustrate an importance of the height of the upper surface 451. In particular, FIG. 8C illustrates a device in which the height of the upper surface is too low. That is, a distance D6 between the upper surface of the fin structures 430 and the upper surface 451 is 10 nm or less. As illustrated in FIG. 8D, the silicidation of the upper surface 451 in that case would result in a silicide layer 485 which contacts the upper surface of fin structures 430, which would cause a transistor performance to be harshly degraded due to a large external resistance.

Figure 8E:
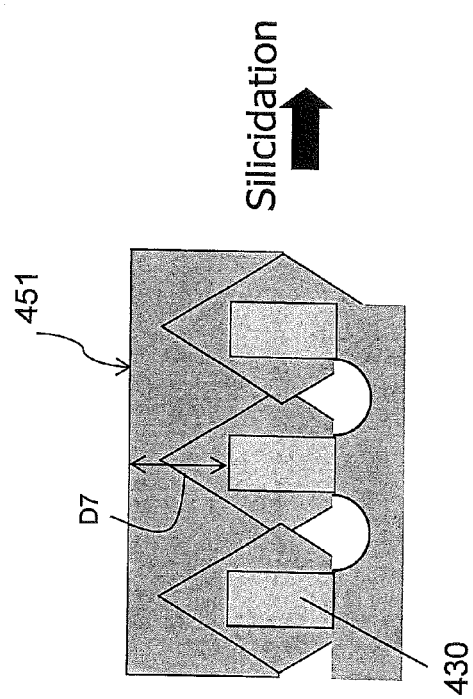
FIG. 8E illustrates another importance of the height of the upper surface 451.

FIG. 8E illustrates a device in which the height of the upper surface is sufficiently high. That is, a distance D7 between the upper surface of the fin structures 430 and the upper surface 451 is greater than 10 nm. As illustrated in FIG. 8F, the silicidation of the upper surface 451 in that case would result in a silicide layer 485 which does not contact the upper surface of fin structures 430, and will, therefore, not cause a transistor performance to be harshly degraded.

That is, typical silicide thickness is 10 nm. Therefore, the epitaxial layer 450 must be grown to have an upper surface having a height that is greater than 10 nm from the top of the fins to avoid silicide proximity.

FIGS. 9A-9B illustrate a method 900 of manufacturing a semiconductor device, according to another exemplary aspect of the present invention. FIG. 9A illustrates the device 490 after the planarizing of the upper surface 451. As illustrated in FIG. 9B, in the method 900, after the planarizing of the upper surface 451, an epitaxial layer 452 may be formed on the upper surface 451 by performing another epitaxial growth. This may be used, for example, to more particularly define a height of the diffusion region.

In this case, the epitaxial layer 452 may include a material which is different than a material of the epitaxial layer 450. In addition, the epitaxial layer 450 may include a first dopant type and a first dopant amount, and the epitaxial layer 452 may include a second dopant type and a second dopant amount. Further, the first dopant type may be different from the second dopant type, and/or the first dopant amount may be different from the second dopant amount.

FIGS. 10A-10B illustrate a method 1000 of manufacturing a semiconductor device, according to another exemplary aspect of the present invention. As illustrated in FIG. 10A after the planarizing of the upper surface 451 to a point where a height of the upper surface 451 is greater than a height of upper surface of the fin structures 430 (e.g., see FIG. 4E), the upper surface 451 is additionally planarized (e.g., etched by HCl etch back) to further reduce the height of the upper surface 451 to a point which is less than a height of upper surface of the fin structures 430.

As illustrated in FIG. 10B, in the method 1000, after the additional planarizing of the upper surface 451, an epitaxial layer 457 may be formed on the upper surface 451 by performing another epitaxial growth. This may be used, for example, to more particularly define a height of the diffusion region. In particular, a height of the upper surface of the epitaxial layer 457 may be greater than a height of the upper surface of the fin structures 430. In addition, another epitaxial layer 458 may be formed on the epitaxial layer 458, in order to more particularly define a height of the diffusion region.

The epitaxial layer 457 may include a material which is different than a material of the epitaxial layer 450. In addition, the epitaxial layer 450 may include a first dopant type and a first dopant amount, and the epitaxial layer 457 may include a second dopant type and a second dopant amount. Further, the first dopant type may be different from the second dopant type, and/or the first dopant amount may be different from the second dopant amount.

Similarly, the epitaxial layer 458 may include a material which is different than a material of the epitaxial layer 457 and different from a material of the epitaxial layer 450. For example, the epitaxial layer 450 may include a first dopant type and a first dopant amount, the epitaxial layer 457 may include a second dopant type and a second dopant amount, and the epitaxial layer 458 may include a third dopant type and a third dopant amount. Further, the first dopant type may be different from the second dopant type and the third dopant type, and/or the first dopant amount may be different from the second dopant amount and the third dopant amount.

Thus, the exemplary aspects of the present invention may allow for more precise control over a dopant provide of the diffusion region (e.g., source and drain region) of a semiconductor device (e.g., finFET device).

Figure 11:
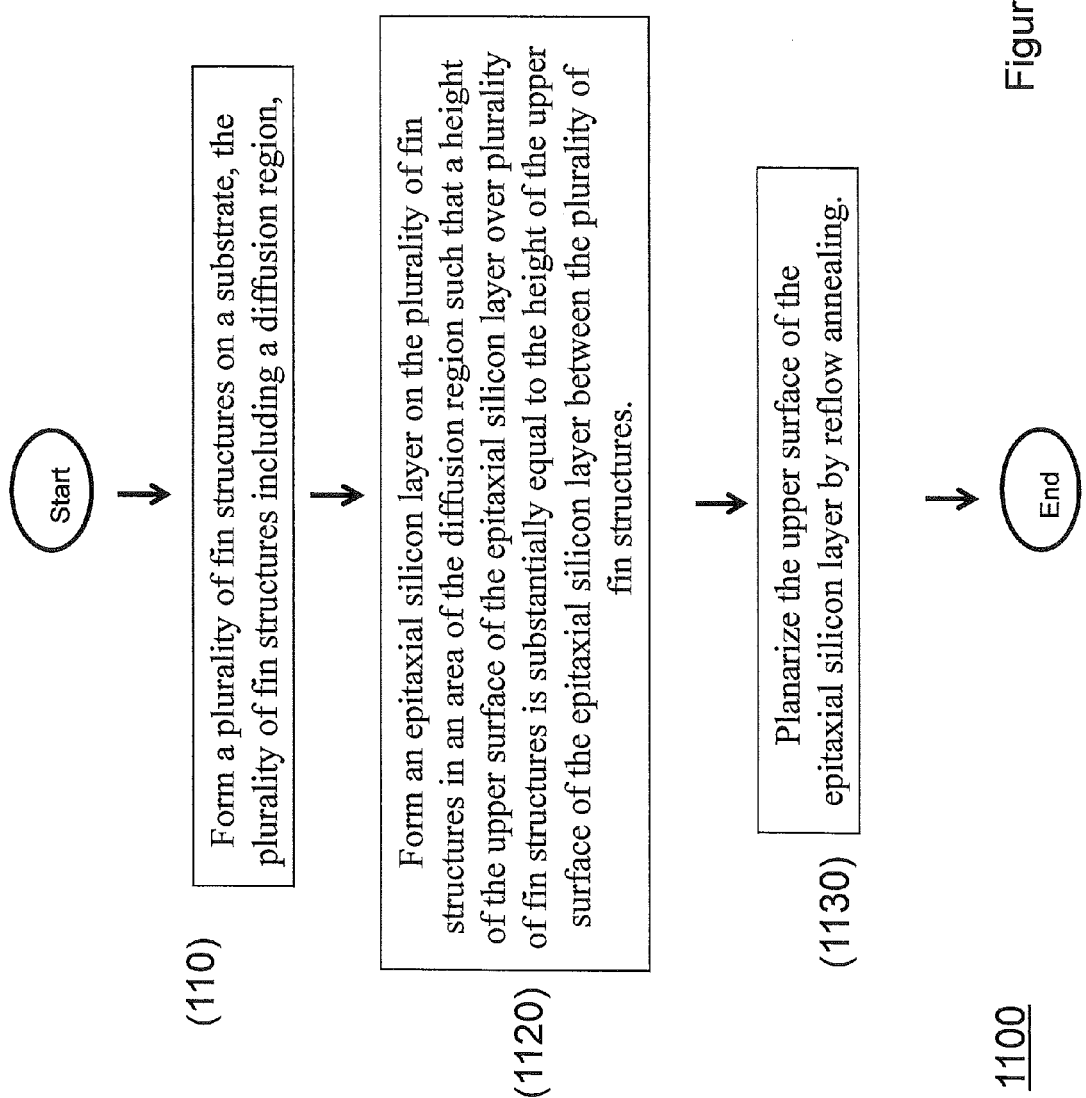
FIG. 11 illustrates a method 1100 of manufacturing a semiconductor device, according to another exemplary aspect of the present invention.

FIG. 11 illustrates a method 1100 of manufacturing a semiconductor device, according to another exemplary aspect of the present invention. As illustrated in FIG. 11, the method 1100 includes forming (1110) a plurality of fin structures on a substrate, the plurality of fin structures including a diffusion region, forming (1120) an epitaxial layer on the plurality of fin structures in an area of the diffusion region such that a first growth front of the epitaxial layer on a first fin structure of the plurality of fin structures contacts a second growth front of the epitaxial layer on a second fin structure of the plurality of fin structures, and planarizing (1130) the upper surface of the epitaxial layer by reflow annealing. The reflow annealing may include reflowing an upper portion of the diamond-shaped facet of the epitaxial layer to a location between the plurality of fin structures.

Figure 12C:
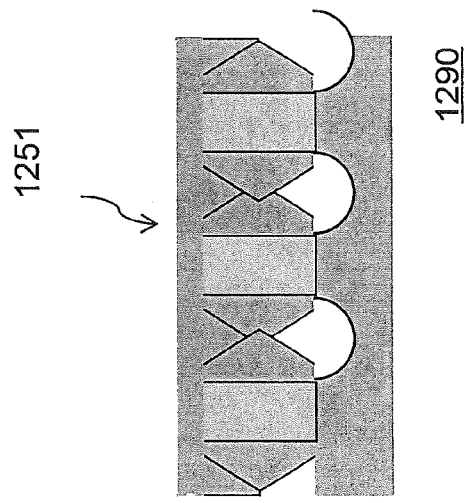
FIG. 12C illustrates another part of method 1200 of manufacturing a semiconductor device which includes reflow annealing, according to another exemplary aspect of the present invention.
Figure 12B:
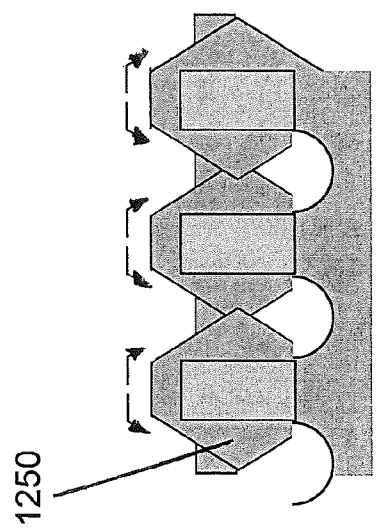
FIG. 12B illustrates another part of method 1200 of manufacturing a semiconductor device which includes reflow annealing, according to another exemplary aspect of the present invention.
Figure 12A:
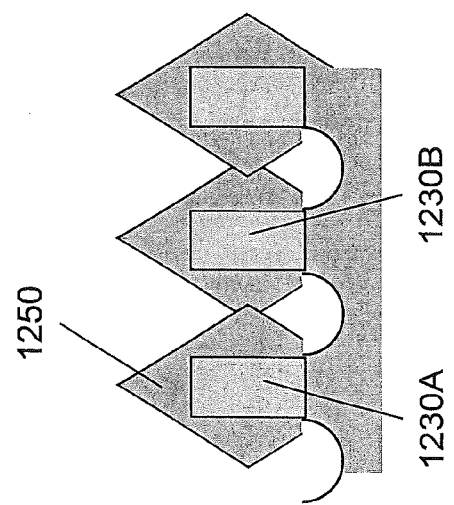
FIG. 12A illustrates a part of a method 1200 of manufacturing a semiconductor device which includes reflow annealing, according to another exemplary aspect of the present invention.

FIGS. 12A-12C illustrate a method 1200 of manufacturing a semiconductor device which includes reflow annealing, according to another exemplary aspect of the present invention. As illustrated in FIG. 12A, the method 1200 includes forming an epitaxial layer 1250 on a plurality of fin structures 1230 (e.g., fin structures of a finFET device) in an area of a diffusion region such that a first growth front of the epitaxial layer 1250 on a first fin structure 1230A of the plurality of fin structures contacts a second growth front of the epitaxial layer on a second fin structure 1230B of the plurality of fin structures 1230. That is, the method 1200 may include stopping the forming of the epitaxial layer 1250 upon the first growth front contacting the second growth front, such that the epitaxial layer 1250 includes a cross-section including a diamond-shaped facet comprising a {111} crystal orientation on the plurality of fin structures 1230.

As illustrated in FIG. 12B, the method 1200 also includes planarizing the upper surface 1251 of the epitaxial layer 1250 by reflow annealing. The reflow annealing may include, for example, annealing in a hydrogen ambient. As illustrated by the arrows in FIG. 12B, the reflow annealing may include reflowing an upper portion of the diamond-shaped facet of the epitaxial layer 1250 to a location between the plurality of fin structures 1230. That is, in the method 1200, the upper portion of the diamond-shaped facet may be moved by the reflow annealing to a location which is above the area where the first growth front contacts the second growth front.

As illustrated in FIG. 12C, the upper surface 1251 after the planarization may have an improved surface roughness compared to the upper surface 251 of the conventional device 290. In particular, after the planarizing of the upper surface 1251, a difference between a greatest height of the upper surface 1251 and the least height may be less than 5 nm, which is significantly improved over the conventional device 290 in which the difference between peaks and valleys may be at least 10 nm.

Further, the planarizing of the upper surface 1251 of the epitaxial layer 1250 may be performed after the forming of the epitaxial layer 1250 without interruption and in the same chamber.

In addition, other processing of the device 1290 may be similar the processing of the device 490 described above. For example, another epitaxial layer may be formed on the epitaxial layer 1250, the epitaxial layer may be silicided, etc.

In addition, after the planarization of the upper surface 1251 by reflow annealing in FIG. 12B, another planarization may be performed in order to further improve the upper surface 1251. For example, an HCl etch back may be performed after the planarization by reflow annealing.

Another exemplary aspect of the present invention is directed to a semiconductor device (e.g., semiconductor device 490, 1290) including a plurality of fin structures formed on a substrate, the plurality of fin structures including a diffusion region, and an epitaxial layer (e.g., epitaxial layer 450, 1250) on the plurality of fin structures in an area of the diffusion region such that a height of the upper surface of the epitaxial layer over plurality of fin structures is substantially equal to the height of the upper surface of the epitaxial layer between the plurality of fin structures.

The upper surface of the epitaxial layer may be substantially flat. In particular, a variation in the height of the upper surface of the epitaxial layer may be less than 5 nm.

The semiconductor device may also include a silicide layer formed on the upper surface of the upper surface (e.g., upper surface 451, 1251) of the epitaxial layer. An upper surface of the silicide layer may include a substantially uniform upper surface.

The semiconductor device may also include an other epitaxial layer formed on the upper surface (e.g., upper surface 451, 1251) of the epitaxial layer. For example, the epitaxial layer may include a first dopant type and a first dopant amount, and the other epitaxial layer may include a second dopant type and a second dopant amount. Further, the first dopant type may be different from the second dopant type, and the first dopant amount may be different from the second dopant amount.

FIG. 13 illustrates a system 1300 for manufacturing a semiconductor device, according to an exemplary aspect of the present invention.

As illustrated in FIG. 13, the system 1300 includes an epitaxial growth chamber 1350 (e.g., low pressure chemical vapor deposition (LPCVD chamber) in which the forming of the epitaxial layer 450, 1250 and the planarizing an upper surface 451, 1251 of the epitaxial layer 450, 1250 (e.g., etching back the upper surface or performing a reflow annealing of the epitaxial layer) may be performed. That is, for example, a semiconductor device 1301 including a plurality of fin structures (e.g., see FIG. 4A) may be inserted into the chamber 1350, and the device 1301 may be processed in the chamber 1350 to form the device 1391 including an epitaxial layer having a planarized upper surface.

As illustrated in FIG. 13, the chamber 1350 may also generate data which the control device 1360 may use to control an operation of the chambers 1350. For example, the chamber 1360 may include a sensor for detecting a height of the epitaxial layer, so that the chamber 1350 may generate height data which is fed back to the control device 1360. For example, the control device 1360 may control an operation of a gas valve in a gas flow line to the deposition chamber 1360 to control a growth rate of the epitaxial layer, based on the height data generated by the chamber 1350.

Similarly, the chamber 1350 may include a sensor for detecting a temperature in the chamber 1350, so that the chamber 1350 may generate temperature data which is fed back to the control device 1360. In this case, the control device 1360 may control an operation of a heater in the chamber 1350 based on the temperature data generated by the chamber 1350.

The system 1300 may also include a memory device 1365 (e.g., random access memory (RAM), read-only memory (ROM), etc.) for storing programs and data. For example, the memory device 1365 may store data input by the user, and data generated by chamber 1350. The memory device 1365 may be accessed by the control device 1360, and may store algorithms and programs for allowing the control device 1360 to control the features and functions of the system 1300.

In particular, the control device 1360 may control the control features and functions of the chamber 1350. For example, the control device 1360 may access the programs stored in the memory device 1365, in order to control gas flow rates, heating devices and vacuum devices associated with the chamber, so as to form an epitaxial layer on the plurality of fin structures, and in order to planarize the upper surface of the epitaxial layer by etch back or by reflow annealing.

The system 1300 may also include an input device 1380 (e.g., keyboard, mouse, touchscreen, etc.) for inputting control parameters to the control device 1360. In particular, the input device 1380 and the control device 1360 may be integrally formed as a single unit.

For example, a user may use the input device 1380 to input the number of a duration of the forming of the epitaxial layer, or a thickness of the epitaxial layer after the epitaxial growth, a duration of the planarizing of the upper surface of the epitaxial layer, a thickness of the planarized epitaxial layer, etc.

The control device 1360 may also be programmed to set some control parameters based on a user input. For example, the control device 1360 may include a control panel which displays a graphic user interface (GUI) which a user may manipulate by using the input device 1380. The user may view the GUI while inputting data which is used by the control device 1360 to set some of the control parameters.

For example, a user may input a desired thickness of the planarized epitaxial layer by using the input device 1380, and based on the user input, the control device 1360 may generate (e.g., automatically generate) a preferred set of operating parameters, which may be displayed on the GUI and viewed by the user. For example, the control device 1360 may set (e.g., automatically set) a duration of the forming of the epitaxial layer based on the thickness data input by the user.

The memory device 1380 may also store history data of past operations. Such history data may include, for example, the name of the human operator who operated the system 1300, the date and time of the processing performed in the chamber 1350, temperatures, pressures, gas flow rates and durations of the processing performed in the chamber 1350, etc. The system 1300 may also include a feedback feature which may allow the programs stored in the memory device 1380 to be updated and improved based on the history data stored in the memory device 1380. In addition, the user may also use the input device 1380 to adjust the programs stored in the memory device 1380 based on a result of past processing, or based upon the user's changing preferences.

For example, Table 2 below provides a chart illustrating some of the parameters which may be set or controlled by the control device 1360, for performing the planarizing of an upper surface 451 of the epitaxial layer 450 (e.g., by performing an etch back) in the method (e.g., method 300, 400) of manufacturing a semiconductor device, according to an exemplary aspect of the present invention.

In short, the control device 1360 may set or control a process condition for etch back (e.g., HCl etch back) to be in the range of the process conditions which is typical for a LPCVD epitaxial chamber.

TABLE 2

| Temp (° C.) | Press (Torr) | H$_2$ (slm) | HCl (sccm) | Time (s) |
|---|---|---|---|---|
| 600-900 | 2-300 | Standard flow as carrier gas | 100-300 | 100-300 |

Table 3 below provides a chart illustrating some of the parameters which may be set or controlled by the control device 1360, for performing the planarizing of an upper surface 451 of the epitaxial layer 450 (e.g., by performing a reflow annealing) in the method (e.g., method 1100) of manufacturing a semiconductor device, according to an exemplary aspect of the present invention.

TABLE 3

| Temp (° C.) | Press (Torr) | H$_2$ (slm) | Time (s) |
|---|---|---|---|
| 600 to 1000 | 2-200 | Standard flow as carrier gas | 100-1200 |

The features and functions of the system 1300 described above are merely exemplary and are not exhaustive, and should not be considered as limiting the present invention in any manner. For example, the process time may depend greatly on a thickness of the epitaxial layer 450 to be planarized as well as a pressure provided in the chamber. Thus, in some cases, the process time may be different (e.g., greater) than the exemplary times shown in TABLES 2 and 3.

In summary, a problem with conventional methods is that the epitaxial layer includes a surface roughness induced by the fin structures of the diffusion region, and a growth rate of the epitaxial layer is dependent on a crystal plane.

Conventionally, the problem of surface roughness is being solved by increasing a thickness of the epitaxial layer in order to achieve a flat surface on the epitaxial layer. However, thicker epitaxial layer growth causes higher parasitic capacitance and a problem with compatibility with RMG process. Another method of solving the problem of surface roughness is by leaving a protective hard mask on top of the fins. However, leaving the hard mask on the fin structure cannot be adopted for a frigate device.

The exemplary aspects of the present invention may provide a method to improve epitaxial layer topography and control epitaxial layer thickness on a semiconductor device (e.g., an epitaxial layer for merging a diffusion region (e.g., source region, drain region, etc.) of a finFET device).

An exemplary method of the present invention may form a thicker S/D merge epitaxial layer followed by a planarization by performing an in-situ HCl etching back of the epitaxial layer on an S/D region in an epitaxial reactor. Alternatively, the method may not include an "overgrowth" of the epitaxial layer, and perform a planarization by reflow annealing. An advantage of the exemplary aspects of the present invention, is that the planarization (e.g., in-situ HCl etching in the epitaxial reactor, or reflow annealing) may provide a flat epitaxial layer surface on an S/D region with independent control of epitaxial layer thickness. For epitaxial layer height control, an extra hard mask for reactive ion etching (RIE) is not needed.

The exemplary aspects of the present invention may form a merged source/drain structure (e.g., S/D merged finFET) that can be fabricated by 1) formation of the silicon fin array structures with parasitic capacitance (PC), and 2) selective epitaxial material growth such as Si, SiGe for the S/D fin merging in the epitaxial reactor (the material of the source/ drain region (e.g., Si, SiGe, etc.) in nMOS and pMOS may be doped for reduction of the S/D resistance), 3) fin merging by selective epitaxial growth, 4) thicker epitaxial growth to get a flat surface, and 5) in-situ HCl etch back to reduce the epitaxial thickness and maintain the flat surface in the epitaxial reactor.

By the above process flow, the epitaxial merge at the S/D region with a flat surface may be obtained. In addition, the height of the upper surface of the epitaxial layer may be controlled by controlling the HCl etching condition.

The above structure and process may enable the exemplary aspects of the present invention to avoid the difficulties of prior art. Further, a process of the exemplary aspects of the present invention (e.g., thicker S/D merge epitaxial layer followed by in-situ HCl etching back of the epitaxial layer) can be performed in the epitaxial reactor, which may allow the structure (e.g., semiconductor device 490) to be manufactured at low cost. In addition, the exemplary aspects of the present invention may control (e.g., simultaneously with controlling a height of an upper surface of the epitaxial layer) a lateral growth of the epitaxial layer at an edge of the fin.

Further, a process of the exemplary aspects of the present invention may be applied to a non-rotated wafer or a rotated wafer.

Figure 14:
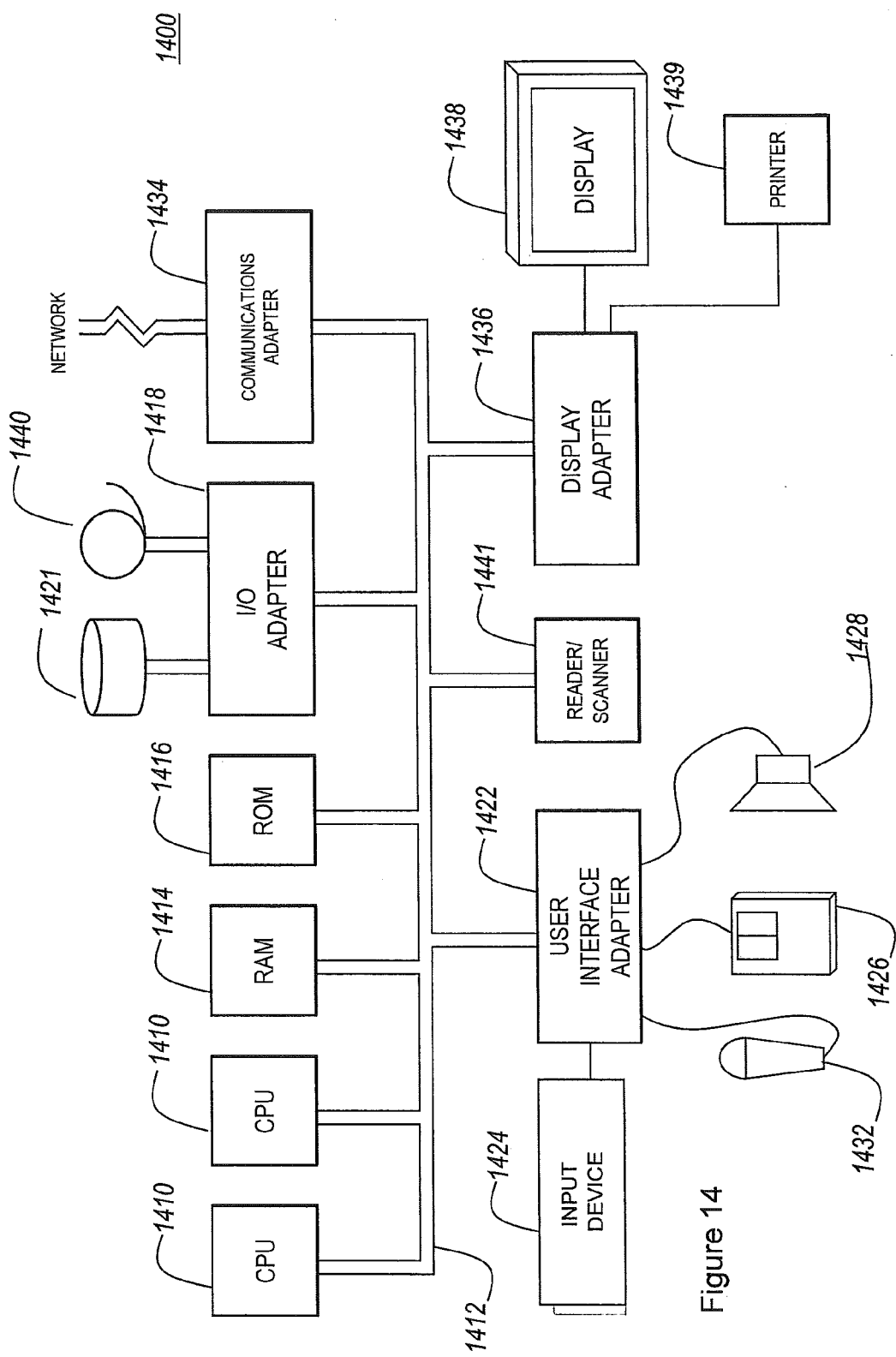
FIG. 14 illustrates a typical hardware configuration 1400 that may be used to implement the system and method of the present invention, in accordance with an exemplary aspect of the present invention.
Figure 15:
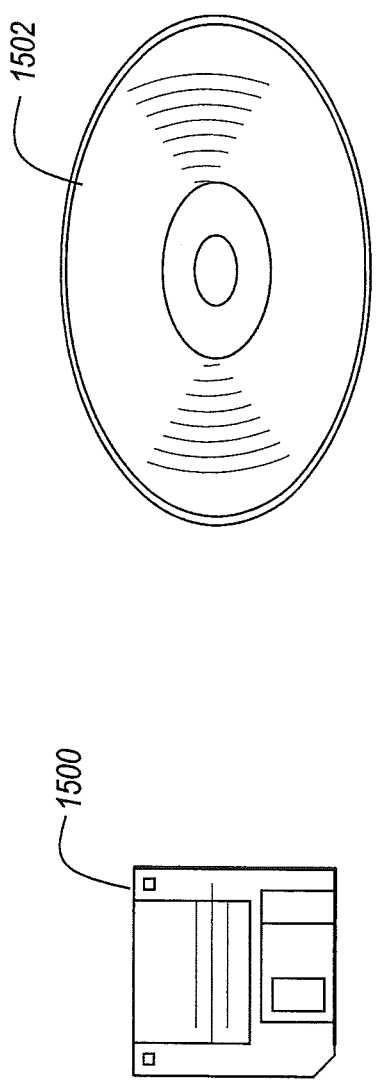
FIG. 15 illustrates a magnetic data storage diskette 1500 and compact disc (CD) 1502 that may be used to store instructions for performing the inventive method of the present invention, in accordance with an exemplary aspect of the present invention.

Referring again to the drawings, FIG. 14 illustrates a system 1400 including a typical hardware configuration which may be used for implementing a system (e.g., system 1300) for manufacturing a semiconductor device, and method (e.g., method 300, 1100) of forming a semiconductor device, according to an exemplary aspect of the present invention.

The configuration of the system 1400 has preferably at least one processor or central processing unit (CPU) 1410 (e.g., control device 1360 in system 1300). The CPUs 1410 are interconnected via a system bus 1412 to a random access memory (RAM) 1414, read-only memory (ROM) 1416 (e.g., memory device 1365 in system 1300), input/output (I/O) adapter 1418 (for connecting peripheral devices such as disk units 1421 and tape drives 1440 to the bus 1412), user interface adapter 1422 (for connecting a keyboard 1424, mouse 1426, speaker 1428, microphone 1432 and/or other user interface device to the bus 1412), a communication adapter 1434 for connecting an information handling system to a data processing network, the Internet, an Intranet, a personal area network (PAN), etc., and a display adapter 1436 for connecting the bus 1412 to a display device 1438 and/or printer 1439. Further, an automated reader/scanner 1441 may be included. Such readers/scanners are commercially available from many sources.

In addition to the system described above, a different aspect of the invention includes a computer-implemented method for performing the above method. As an example, this method may be implemented in the particular environment discussed above.

Such a method may be implemented, for example, by operating a computer, as embodied by a digital data processing apparatus, to execute a sequence of machine-readable instructions. These instructions may reside in various types of signal-bearing media.

Thus, this aspect of the present invention is directed to a programmed product, including non-transitory, signal-bearing media tangibly embodying a program of machine-readable instructions executable by a digital data processor to perform the above method.

Such a method may be implemented, for example, by operating the CPU 1410 to execute a sequence of machine-readable instructions. These instructions may reside in various types of non-transitory, signal bearing media.

Thus, this aspect of the present invention is directed to a programmed product, including non-transitory, signal-bearing media tangibly embodying a program of machine-readable instructions executable by a digital data processor incorporating the CPU 1410 and hardware above, to perform the method of the invention.

This non-transitory, signal-bearing media may include, for example, a RAM contained within the CPU 1410, as represented by the fast-access storage for example. Alternatively, the instructions may be contained in another non-transitory, signal-bearing media, such as a magnetic data storage diskette 1500 or compact disc 1502 (FIG. 15), directly or indirectly accessible by the CPU 1410.

Whether contained in the computer server/CPU 1410, or elsewhere, the instructions may be stored on a variety of machine-readable data storage media, such as DASD storage (e.g., a conventional "hard drive" or a RAID array), magnetic tape, electronic read-only memory (e.g., ROM, EPROM, or EEPROM), an optical storage device (e.g., CD-ROM, WORM, DVD, digital optical tape, etc.), paper "punch" cards, or other suitable signal-bearing media including transmission media such as digital and analog and communication links and wireless. In an illustrative embodiment of the invention, the machine-readable instructions may comprise software object code, compiled from a language such as C, C++, etc.

Thus, an exemplary aspect of the present invention is directed to a programmable storage medium tangibly embodying a program of machine-readable instructions executable by a digital processing apparatus to perform a method of manufacturing a semiconductor device (e.g., method 300, 1100).

With its unique and novel features, the present invention may provide a method and system of manufacturing a semiconductor device which may provide an improved upper surface of an epitaxial layer.

While the invention has been described in terms of one or more exemplary embodiments, those skilled in the art will recognize that the invention can be practiced with modification within the spirit and scope of the appended claims. Specifically, one of ordinary skill in the art will understand that the drawings herein are meant to be illustrative, and the design of the inventive method and system is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A method of manufacturing a semiconductor device, comprising:
    forming a plurality of fin structures on a substrate, the plurality of fin structures including a diffusion region;
    forming an epitaxial layer on the plurality of fin structures in an area of the diffusion region such that a cross-section of the epitaxial layer includes a diamond-shaped facet comprising a $\{111\}$ crystal orientation on the plurality of fin structures;
    growing the diamond-shaped facet of the epitaxial layer such that a height of the upper surface of the epitaxial layer over plurality of fin structures is substantially equal to the height of the upper surface of the epitaxial layer between the plurality of fin structures; and planarizing the upper surface of the epitaxial layer by etch back.

2. The method of claim 1, wherein the growing of the diamond-shaped facet of the epitaxial layer comprises growing the diamond-shaped facet such that a first growth front of the epitaxial layer on a first fin structure of the plurality of fin structures contacts a second growth front of the epitaxial layer on a second fin structure of the plurality of fin structures.

3. The method of claim 2, further comprising:
concurrently with the planarizing of the upper surface of the epitaxial layer, etching back a lateral side surface of the epitaxial layer at an edge of the plurality of fin structures.

4. The method of claim 3, wherein the substrate comprises a buried oxide layer, and
wherein the etching back of the lateral side surface of the epitaxial layer comprises etching back the lateral side surface of the epitaxial layer such that the lateral side surface extends from the buried oxide layer to the upper surface of the epitaxial layer, and is substantially perpendicular to the upper surface of the epitaxial silicon layer.

5. The method of claim 4, wherein the etching back of the lateral side surface of the epitaxial layer comprises etching back the lateral side surface of the epitaxial layer such that a distance between the lateral side surface and an outermost fin structure of the plurality of fin structures is 10 nm or less.

6. The method of claim 1, wherein the planarizing of the upper surface of the epitaxial layer is performed after the forming of the epitaxial layer without interruption and in the same chamber.

7. The method of claim 1, wherein the planarizing of the upper surface of the epitaxial layer comprises etching back the upper surface of the epitaxial layer such that a height of the upper surface of the epitaxial layer is greater than a height of an upper surface of the plurality of fin structures.

8. The method of claim 1, wherein the planarizing of the upper surface of the epitaxial layer comprises etching back the upper surface of the epitaxial layer such that a height of the upper surface of the epitaxial layer is less than a height of an upper surface of the plurality of fin structures.

9. The method of claim 1, further comprising:
after the planarizing of the epitaxial layer, forming an other epitaxial layer on the upper surface of the epitaxial layer to tune a height of the diffusion region.

10. The method of claim 9, wherein the epitaxial layer comprises a first dopant type and a first dopant amount, and the other epitaxial layer comprises a second dopant type and a second dopant amount, and
wherein at least one of the first dopant type is different from the second dopant type, and the first dopant amount is different from the second dopant amount.

11. The method of claim 1, further comprising:
depositing a metal layer on the upper surface of the epitaxial layer; and
heating the substrate to silicide the upper surface of the epitaxial layer.

12. The method of claim 1, wherein the planarizing of the upper surface of the epitaxial layer comprises reducing the height of the upper surface of the epitaxial layer such that a distance between an upper surface of the plurality of fin structures and the upper surface of the epitaxial layer is at least 10 nm.

13. The method of claim 1, wherein the planarizing of the upper surface of the epitaxial layer comprises simultaneously decreasing a surface roughness of the upper surface, reducing a thickness of the epitaxial layer, and reducing a lateral width of the epitaxial layer.

14. A method of manufacturing a semiconductor device, comprising:
forming a plurality of fin structures on a substrate, the plurality of fin structures including a diffusion region;
forming an epitaxial layer on the plurality of fin structures in an area of the diffusion region such that a cross-section of the epitaxial layer includes a diamond-shaped facet comprising a {111} crystal orientation on the plurality of fin structures;
stopping the forming of the epitaxial layer upon a first growth front of the epitaxial layer on a first fin structure of the plurality of fin structures contacting a second growth front of the epitaxial layer on a second fin structure of the plurality of fin structures; and
planarizing the upper surface of the epitaxial layer by reflow annealing.

15. The method of claim 14, wherein the planarizing of the upper surface of the epitaxial layer comprises reflowing an upper portion of the diamond-shaped facet of the epitaxial layer to a location between the plurality of fin structures.

16. The method of claim 14, wherein the planarizing of the upper surface of the epitaxial layer is performed after the forming of the epitaxial layer without interruption and in the same chamber.

* * * * *